(12) United States Patent
Elshurafa et al.

(10) Patent No.: US 9,349,786 B2
(45) Date of Patent: May 24, 2016

(54) FRACTAL STRUCTURES FOR FIXED MEMS CAPACITORS

(75) Inventors: Amro M. Elshurafa, Thuwal (SA); Ahmed Gomaa Ahmed Radwan, Thuwal (SA); Ahmed A. Emira, Mission Viejo, CA (US); Khaled Nabil Salama, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 14/239,234

(22) PCT Filed: Aug. 17, 2012

(86) PCT No.: PCT/US2012/051333
§ 371 (c)(1),
(2), (4) Date: May 8, 2014

(87) PCT Pub. No.: WO2013/028514
PCT Pub. Date: Feb. 28, 2013

(65) Prior Publication Data
US 2014/0239446 A1   Aug. 28, 2014

Related U.S. Application Data

(60) Provisional application No. 61/527,237, filed on Aug. 25, 2011.

(51) Int. Cl.
| | |
|---|---|
| *H01L 21/02* | (2006.01) |
| *H01L 49/02* | (2006.01) |
| *H01G 5/18* | (2006.01) |
| *H01G 5/16* | (2006.01) |
| *H01G 7/00* | (2006.01) |
| *H01G 13/00* | (2013.01) |

(52) U.S. Cl.
CPC .................. *H01L 28/40* (2013.01); *H01G 5/16* (2013.01); *H01G 5/18* (2013.01); *H01G 7/00* (2013.01); *H01G 13/00* (2013.01); *H01L 28/86* (2013.01); *Y10T 29/43* (2015.01)

(58) Field of Classification Search
CPC .............................. H01L 28/86; H01L 28/40
See application file for complete search history.

(56) References Cited

U.S. PATENT DOCUMENTS

| | | | |
|---|---|---|---|
| 6,028,990 A * | 2/2000 | Shahani et al. .................. 716/55 |
| 6,750,745 B1 | 6/2004 | Wei et al. |
| 7,551,094 B2 | 6/2009 | Veerasamy |
| 7,617,577 B2 * | 11/2009 | Ebel et al. ..................... 29/25.42 |
| 7,994,609 B2 * | 8/2011 | Quinn ................. H01L 23/5223 257/499 |
| 2004/0114301 A1 | 6/2004 | Jeon et al. |
| 2007/0194406 A1 | 8/2007 | Patel et al. |
| 2010/0055507 A1* | 3/2010 | Morand ......................... 429/12 |
| 2014/0240894 A1* | 8/2014 | Elshurafa et al. ............. 361/281 |

OTHER PUBLICATIONS

International Search Report Application No. PCT/US2012/051333 dated Nov. 2, 2012, 2 pages.

* cited by examiner

*Primary Examiner* — Nicholas Tobergte
(74) *Attorney, Agent, or Firm* — Thomas | Horstemeyer LLP; Christopher Linder; Randy Schoen

(57) ABSTRACT

An embodiment of a fractal fixed capacitor comprises a capacitor body in a microelectromechanical system (MEMS) structure. The capacitor body has a first plate with a fractal shape separated by a horizontal distance from a second plate with a fractal shape. The first plate and the second plate are within the same plane. Such a fractal fixed capacitor further comprises a substrate above which the capacitor body is positioned.

16 Claims, 12 Drawing Sheets

US 9,349,786 B2

FRACTAL STRUCTURES FOR FIXED MEMS CAPACITORS

CROSS-REFERENCE TO RELATED APPLICATIONS

This application is the National Stage of International Application No. PCT/US2012/051333, filed Aug. 17, 2012, which claims the benefit of and priority to U.S. provisional application to 61/527,237, filed Aug. 25, 2011, the contents of all of which are incorporated by reference as if fully set forth herein.

TECHNICAL FIELD

The present disclosure discloses embodiments of fixed MEMS fractal capacitors.

BACKGROUND

The parallel-plate-type capacitor (PPC) is ubiquitously used in integrated circuits (ICs). While a parallel-plate-type capacitor may provide high capacitance densities in general, capacitors nonetheless still consume a significant area in most chip designs and enhancing their densities even further is an active area of research.

In microelectromechanical systems (MEMS), the capacitance of PPCs is even lower (as compared to Complimentary Metal-Oxide-Semiconductor (CMOS) capacitors), since the sacrificial layer is etched away to allow other components to move and air remains as the dielectric. Further, MEMS PPCs suffer from other problems including plate warping due to residual stresses for example.

SUMMARY

Fixed fractal capacitors, introduced initially in CMOS (Complimentary Metal-Oxide-Semiconductor) in 1998, are a solution for increasing the capacitance density. Fractal capacitors do not only rely on the typical vertical capacitance present between two different layers, but also benefit from horizontal capacitances given the continuous and fast downscaling of lateral dimensions in processes.

Some theoretical analysis on fixed fractal capacitors followed in 2001 and 2002. However, since 2002, no significant advancement has been witnessed in fractal capacitors with barely any papers published.

Embodiments of the present disclosure create fractal capacitors in MEMS technology. In accordance with the present disclosure, one embodiment of a fractal fixed capacitor comprises a capacitor body in a microelectromechanical system (MEMS) structure, wherein the capacitor body has a first metal plate (the signal terminal, for example) with a fractal shape separated by a horizontal distance from a second metal plate (the ground terminal) with a fractal shape, wherein the first metal plate and the second metal plate are within the same plane. Moreover, the first and second metal fractal plates are complementary to each other with respect to their geometries, i.e. if the horizontal distance becomes no longer present, the two plates add up to a complete plate. The capacitor is also a specific distance above the substrate and this distance is governed by the process.

It is noted that the underlying technology of MEMS is different than CMOS. For example, in MEMS, structural components are moving, such as actuators, or there may also be fluid moving within the structure. Accordingly, MEMS do not have the same limitations as in CMOS.

For instance, there are many elements applicable to creating fractals in MEMS that are not applicable to CMOS. In general, to create a good capacitor, two plates or metal layers are used, since metal is a good conductor and increases the quality factor of the capacitor. In MEMS, however, structural components of the capacitor will move. Therefore, a chosen layer needs to be a good mechanical material possessing good mechanical properties in order for the desired structure to bend and/or stretch well to ultimately perform acceptably. Accordingly, most MEMS processes have one single metal layer and many polysilicon layers because polysilicon is a very good mechanical material. Therefore, a parallel plate capacitor in MEMS will be comprised of a metal layer and a polysilicon layer. Polysilicon however, is a semiconductor. Hence, the capacitor will possess a relatively low quality factor.

For a fractal capacitor in MEMS, instead of dealing with the capacitor as two layers on top of one another and separated by a dielectric, a capacitor may be designed in one metal layer. Accordingly, instead of the layers having a vertical distance (i.e. insulator) between them, a horizontal distance (i.e. insulator) may separate the metal layers. Further, the fractal shape of the metal layer provides a large periphery that allows creating a large capacitance. Additionally, when a fractal capacitor is created within the same plane, both terminals can be created from the same metal layer and hence not affect the quality factor of the capacitor.

Select embodiments of the present disclosure demonstrate RF (Radio Frequency) MEMS fractal capacitors. Further, in various embodiments, RF MEMS fractal capacitors possess the highest reported self resonant frequencies of RF MEMS capacitors fabricated in the PolyMUMPS process to date. Explicitly, measurement results show self resonant frequencies beyond 20 GHz for some embodiments. Further, quality factors higher than 4 throughout a band of 2 GHz to 15 GHz and reaching as high as 28 have been measured. An important characteristic of these capacitors is that they required no fabrication intervention or post processing whatsoever. Other benefits that are readily attainable from implementing fractal capacitors in the MEMS technology are discussed below. It is noted that fractal capacitors were introduced in CMOS for the mere reason of increasing the capacitance density. In MEMS however, the benefits are attained on completely different grounds.

The maximum ideal capacitance between two adjacent metals may be calculated using: $C = \in \cdot l \cdot t / d_{min}$, where $\in$ is the dielectric permittivity of the insulator separating the two metals, l is the metal length, t is the metal thickness, and $d_{min}$ is the minimum allowable separating distance between the metals as stipulated by the design rules within the process. Ignoring the value $\in$, the parameters t and $d_{min}$ are usually process specific, unlike l which can be chosen to be any desired distance. Hence, it is generally desirable to choose a process or layers within a process with the highest possible $t/d_{min}$ ratio. In CMOS, the $t/d_{min}$ ratio ("which is named here as the fractal ratio (FR)") is typically '2'. In MEMS however, it is possible to design a customized process with FR emphasis to obtain a high value. Accordingly, the t and $d_{min}$ values may be configurable depending on the process used. As an example, the FR in the MetalMUMPS process can reach up to 10.

Applying the above concepts, the present disclosure provides various embodiments of fixed microelectromechanical system (MEMS) capacitors. An embodiment of a fixed capacitor of the present disclosure includes a capacitor body in a microelectromechanical system (MEMS) structure, wherein the capacitor body has a first plate with a fractal shape separated by a horizontal distance from a second plate with a fractal shape, wherein the first plate and the second plate are within the same plane. Such a fixed capacitor further includes a substrate above which the capacitor body is positioned. For example, the fractal shape of the first plate and the fractal shape of the second plate may comprise a Moore's Fractal. The fixed capacitor may have self resonant frequencies of at least 20 Gigahertz. In an exemplary embodiment, the capacitor body may, but need not, be positioned 3.35 µm above the substrate. The capacitor body may further comprise a first terminal and a second terminal created from a same layer, the same layer comprising the first plate and the second plate.

In accordance with the present disclosure, an embodiment of a fixed capacitor may also include a top first plate in a microelectromechanical system (MEMS) structure separated by a horizontal distance from a top second plate within a same top plane of the microelectromechanical system (MEMS) structure. Such a fixed capacitor further includes a bottom first plate in the microelectromechanical system (MEMS) structure separated by a horizontal distance from a bottom second plate within a same bottom plane of the microelectromechanical system (MEMS) structure. A top lateral capacitance may be provided within the top first plate and the top second plate; a bottom capacitance may be provided within the bottom first plate and the bottom second plate; and/or a vertical capacitance may be provided between the top first and the bottom first plates and between the top second and bottom second plates. The fixed capacitor may further comprise a first terminal created from a first metal layer including the top first plate and the top second plate, and a second terminal created from a second metal layer including the bottom first plate and the bottom second plate. The fixed capacitor may have a first layer that includes the top first plate and the top second plate, a second layer that includes the bottom first plate and the bottom second plate, and/or a total amount of layers in the MEMS structure that includes the first layer, the second layer. The fixed capacitor may further include at least one additional layer that provides additional capacitance. As an example, the total amount of layers may exceed 3. The top first plate and the top second plate may comprise a fractal shape, for example a Moore's Fractal. Similarly, the bottom first plate and the bottom second plate may comprise a fractal shape, for example a Moore's Fractal. Other fractal shapes may be used however. The fixed capacitor may further include an additional layer of plates positioned above the top first plate and the top second plate.

A fixed capacitor of present disclosure may further include an insulating layer separating a first plate from a corresponding second plate in the same plane as the first plate. Also, when the fixed capacitor has a first plate and a corresponding second plate in the same plane both the first plate and the second plate having a fractal shape, the fractal shape of the first plate may geometrically complement the fractal shape of the corresponding second plate in the same plate. The fixed capacitor may have a fractal ratio that is customizable.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

The present disclosure describes many of the benefits that the fractal geometry bestows upon MEMS capacitors. Part of the benefits attained comes from using a general fractal concept, and part of the benefits comes from specifically using Moore's Curves to produce Moore's Fractals.

It is noted that there are hundreds of fractal shapes that are suitable for use herein. It is advantageous to select one that is process friendly, maximizes the perimeter as much as possible, and at the same time provides a preferred layout in terms of measurement and in terms of routing within the circuit itself, with as little compromise as possible. Some embodiments of the present disclosure utilize fractal capacitors that are created in a single layer. With that in mind, a variety of shapes exists and a challenge arises in choosing an optimum geometry with respect to for example: maximizing periphery, being process- and design-rules-friendly (e.g., sharp angles might not develop/etch well for example at very small dimensions or might not be allowed in layout), ease of routing and connection to measurement pads, etc.

Figure 1:
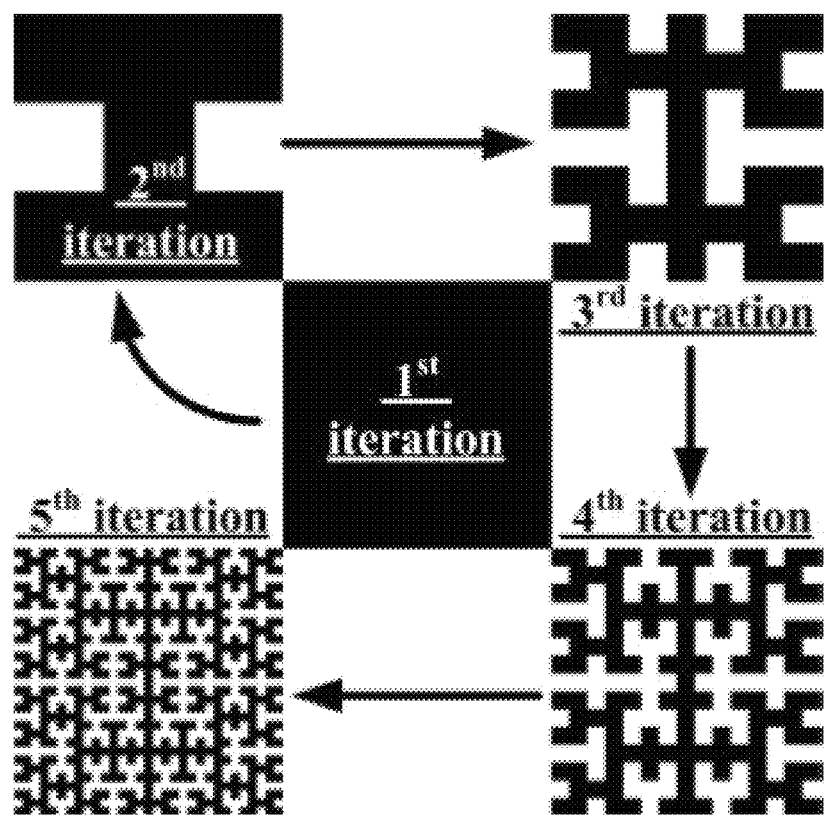
FIG. 1 is a diagram of a process for creating a Moore's Fractal shape utilized in fixed fractal capacitors from a first iteration to a fifth iteration in accordance with the present disclosure.

Given the aforementioned factors, the fractal shape utilized in one embodiment is Moore's Fractal as depicted in FIG. 1, where the 1st iteration all through to the 5th is shown. The Moore's Fractal is described at H. Sagan, *Space-filling curves* vol. 2: Springer-Verlag New York, 1994 and is incorporated herein in its entirety.

Figure 2A:
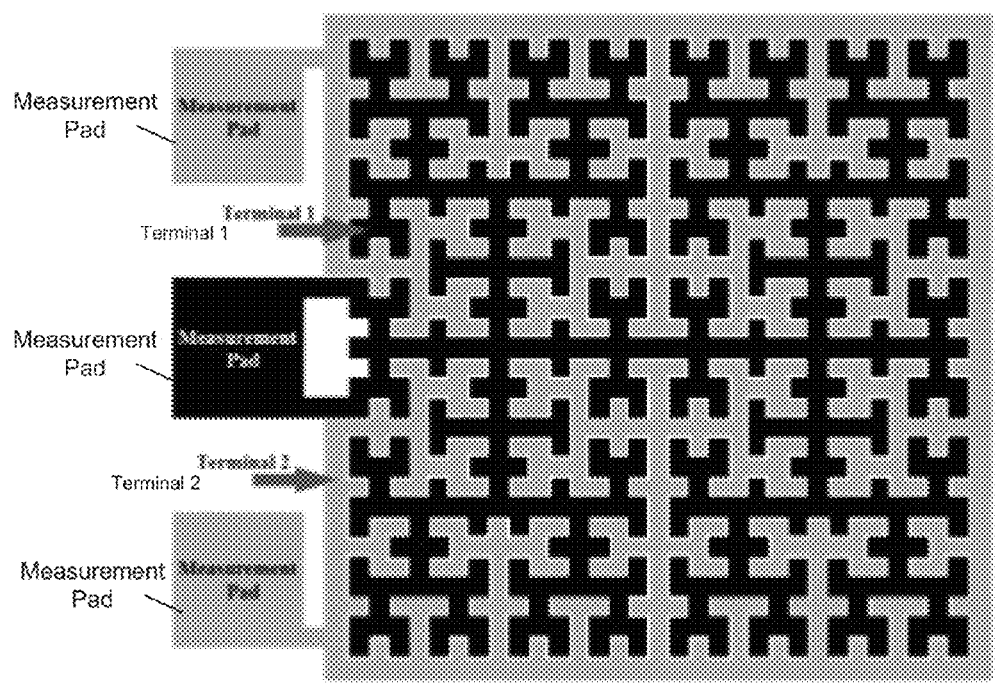
FIGS. 2(a)-2(d) are diagrams of exemplary embodiments of structures of a complete 5th order fractal capacitor and a fabricated 3rd, a fabricated 4th, and a fabricated 5th order fixed fractal capacitors respectively in accordance with the present disclosure.

In FIG. 2(a), a complete structure showing a sample (conceptual) 5th order fractal capacitor is depicted. The shape is rotated by 90° counter-clockwise when compared to FIG. 1 to keep the measurement pads on the left. In FIG. 2(a), the 5th order Moore's Fractal is in black (i.e. the signal terminal), and a complementary shape in gray (i.e. the ground terminal) that fills the void area is also present while keeping a specific separation between both (i.e. $d_{min}$). If no separation existed, both terminals would add up to a simple plate as mentioned earlier.

Figure 2B:
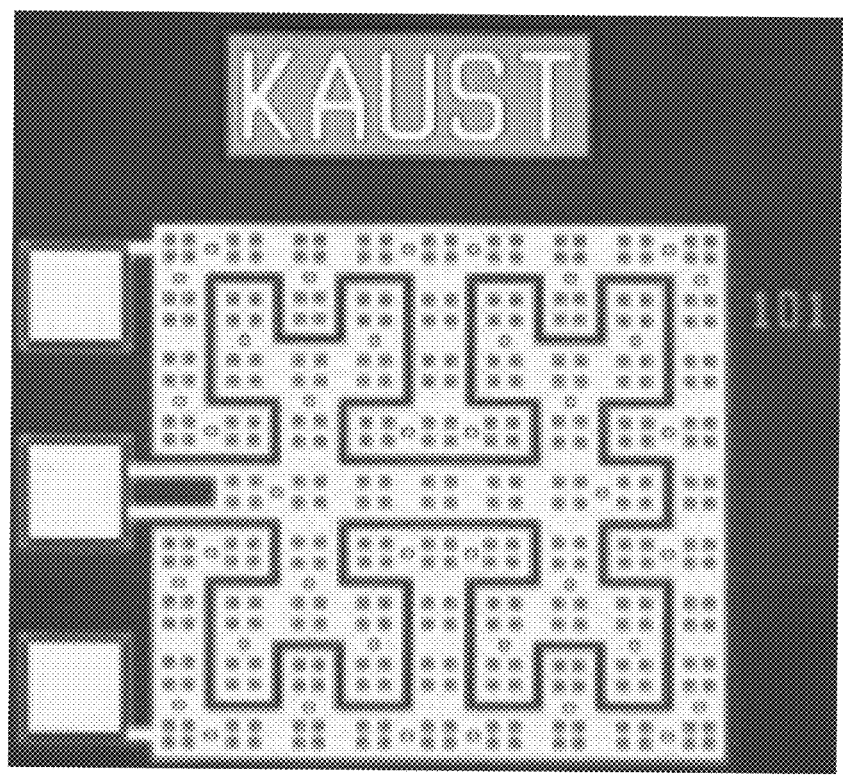
Figure 2C:
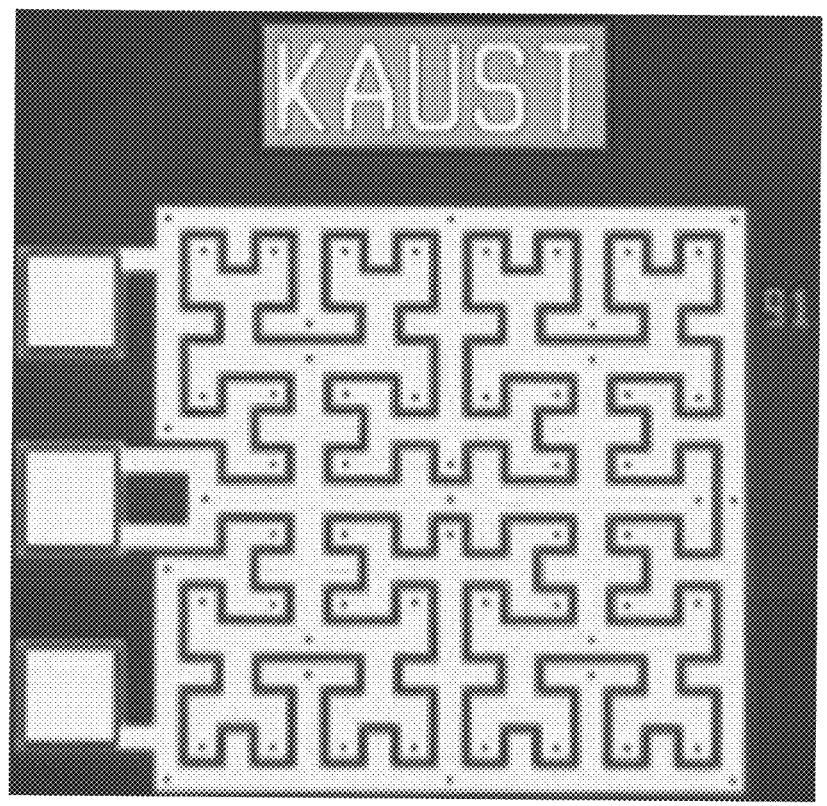
Figure 2D:
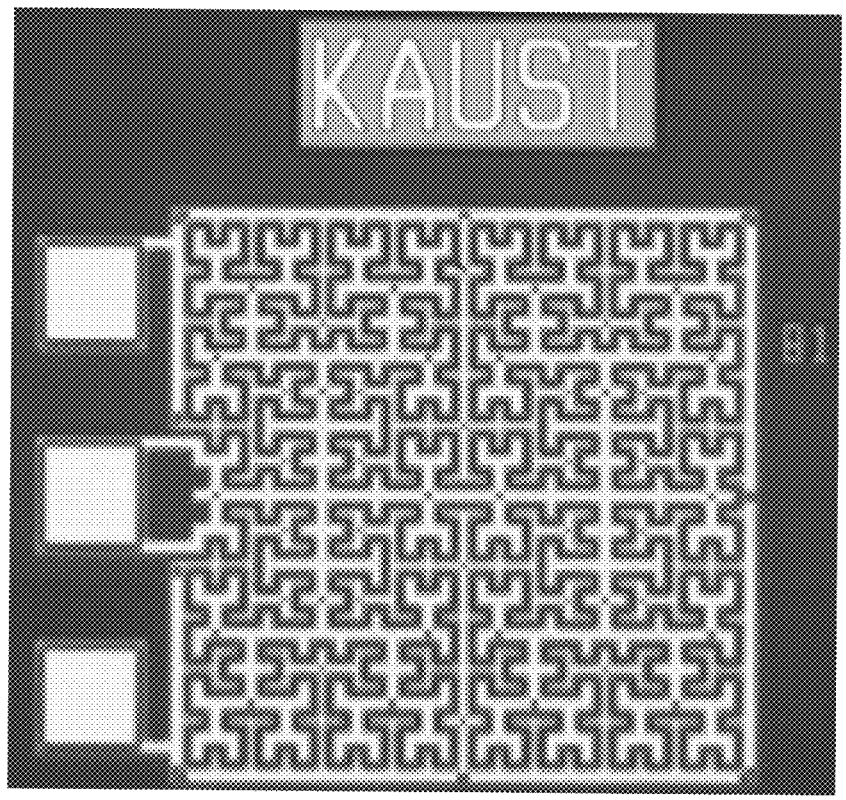

FIGS. 2(b), 2(c), and 2(d) show the 3rd, 4th, and 5th order fabricated capacitors respectively in the PolyMUMPS process. These capacitors are square in shape with a side length of 420 µm (excluding pads). Note that the etching holes are required in FIG. 2(b) only.

Experimental results are now to be discussed with respect to the embodiments represented in FIG. 2. For comparison purposes, the 3rd, 4th, and 5th iterations were fabricated in the PolyMUMPS process. A single layer comprised of METAL and POLY2 was used to create the capacitor. Hence, the capacitor was 2 µm thick and 3.35 µm above the substrate; the latter distance allowed suppressing parasitics significantly. A minimum separation, $d_{min}$, of 2 µm was used throughout the structure.

Figure 3:
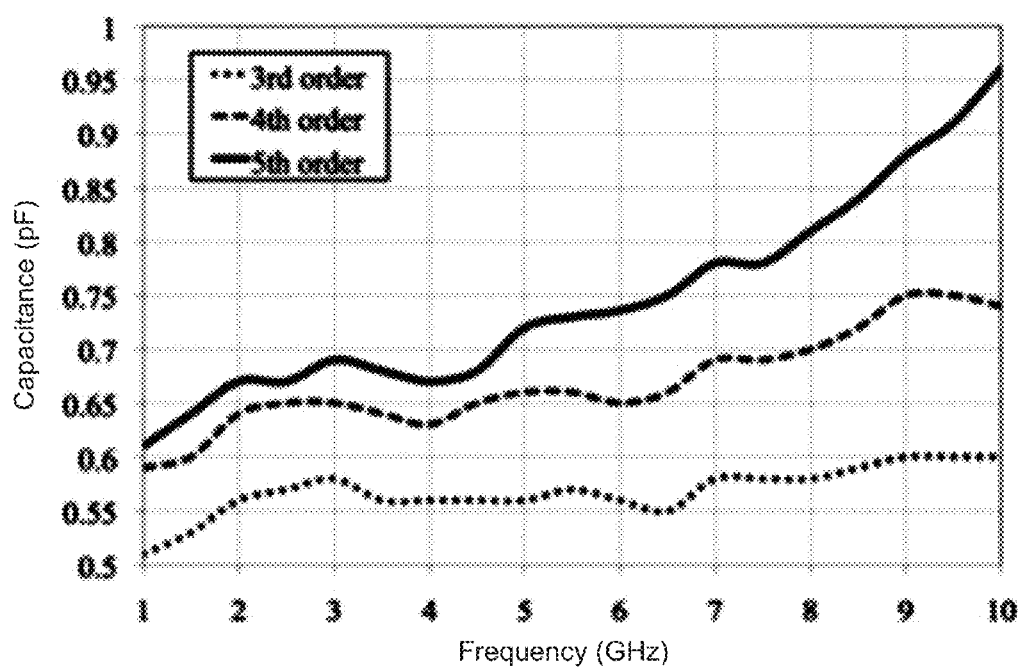
FIG. 3 is a diagram of measured capacitance versus frequency for fabricated capacitors versions of 3rd, 4th, and 5th order fixed fractal capacitors in accordance with the present disclosure.
Figure 4:
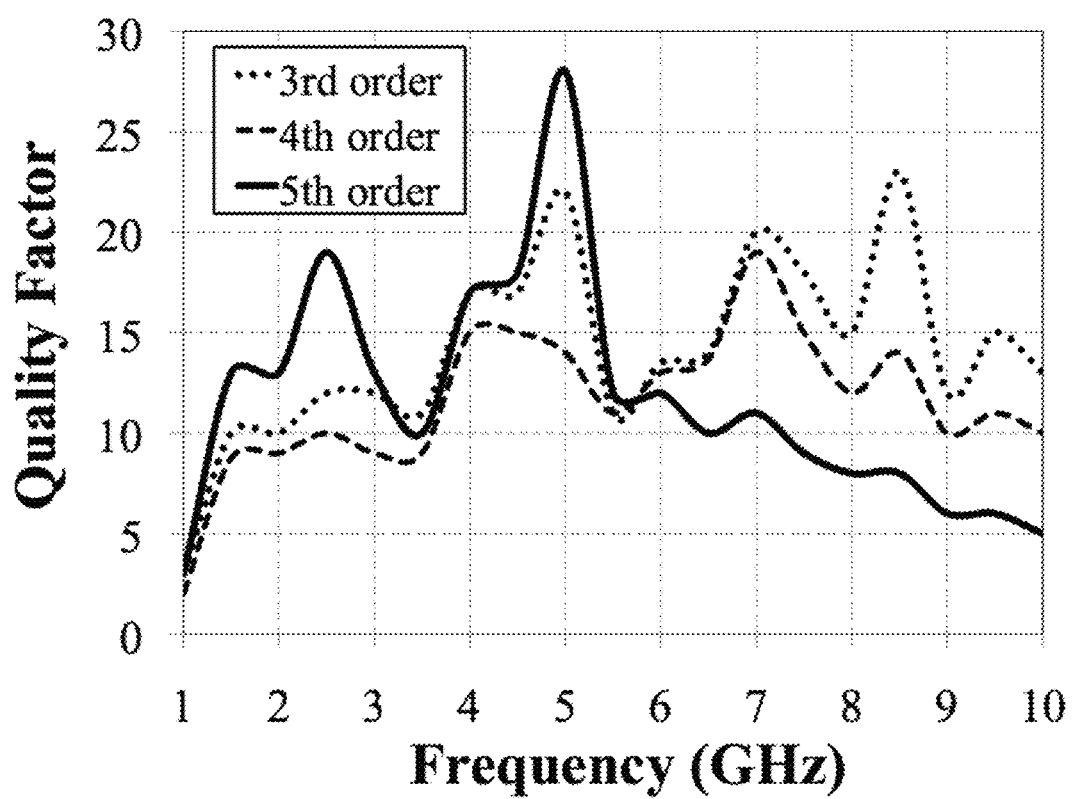
FIG. 4 is a diagram of measured quality factor (Q) plotted versus frequency for the fabricated capacitors versions of 3rd, 4th, and 5th order fixed fractal capacitors in accordance with the present disclosure.

In FIG. 3, the measured capacitance is plotted versus frequency for the three capacitors versions. The capacitance measurements from 1 GHz to 10 GHz are shown. As expected, as the fractal order increases, the capacitance also increases. In FIG. 4, the measured quality factor (Q) is plotted versus frequency for the three capacitors versions and it is evident how the Q is considerably high throughout this frequency range.

Figure 5:
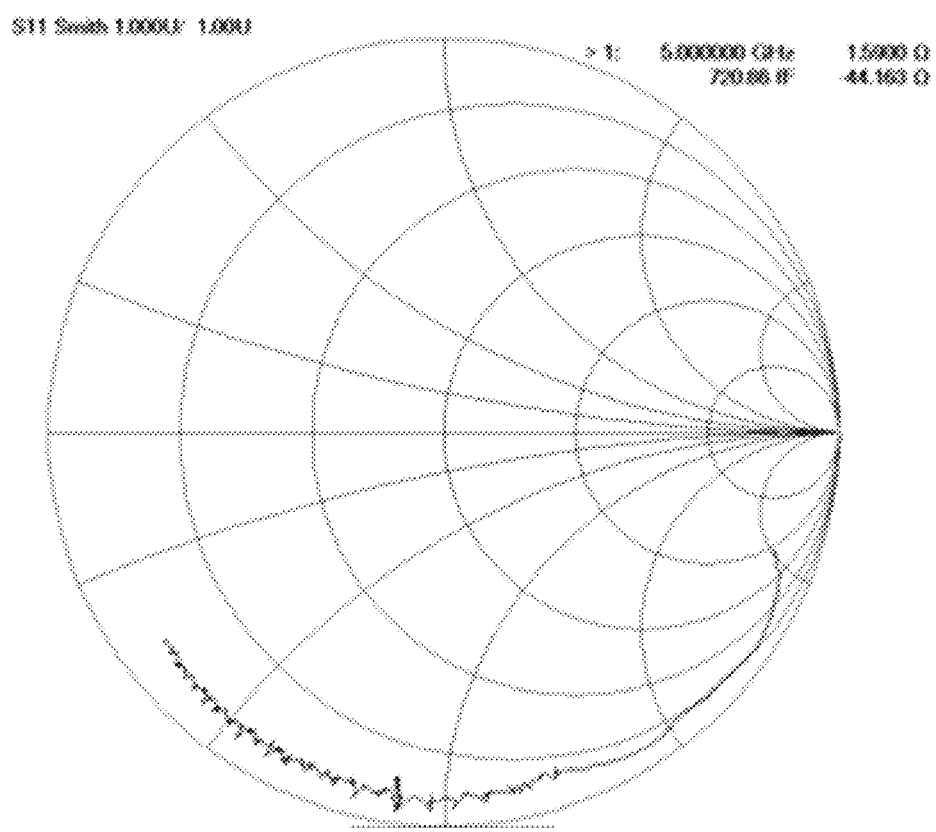
FIG. 5 is a diagram of a sample $S_{11}$ measurement for a 5th order fixed fractal capacitor according to various embodiments of the present disclosure.

A sample $S_{11}$ measurement is shown in FIG. 5 for the 5th order capacitor where the return loss is shown from 1 GHz to 10 GHz. Specifically, the Q is shown to be 28 at 5 GHz, which is the highest reported quality factor to date at these frequencies in PolyMUMPS.

Figure 6:
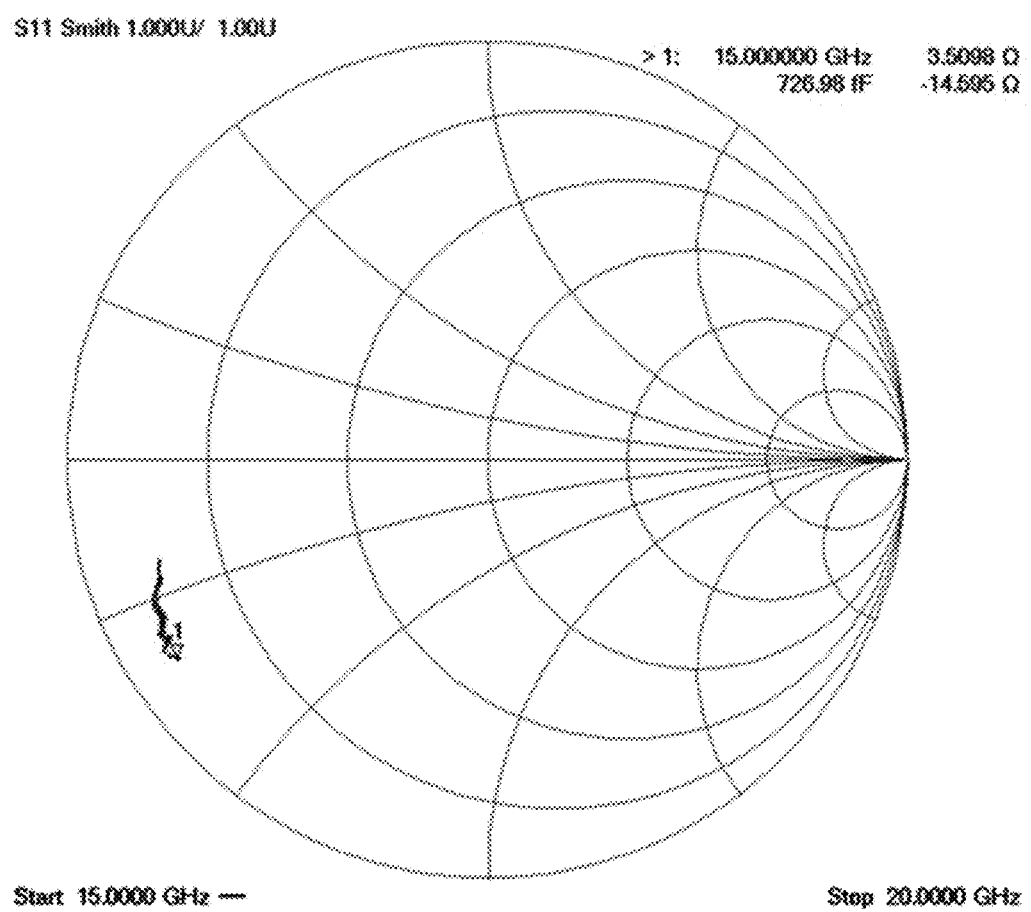
FIG. 6 is a diagram of a sample $S_{11}$ measurement for a 3rd order fixed fractal capacitor according to various embodiments of the present disclosure.

A final sample measurement (from 15 GHz to 20 GHz) is shown in FIG. 6 and clearly shows that the SRF for the 3rd order capacitor is beyond 20 GHz. Further, it shows that the Q is larger than 4 at 15 GHz; which is adequate for many integrated circuit applications. The SRFs for the 4th and 5th order capacitors are 19.795 GHz and 15.59 GHz respectively. These appear to be the highest SRFs reported for capacitors in PolyMUMPS, and are especially noteworthy given that no fabrication intervention or post-processing, whatsoever, is performed. The highest reported SRF in PolyMUMPS previously was 11 GHz and Q was not reported. See M. Bakri-Kassem and R. R. Mansour, "A high-tuning-range MEMS variable capacitor using carrier beams," *Electrical and Computer Engineering, Canadian Journal of*, vol. 31, pp. 89-95, 2006.

Figure 7:
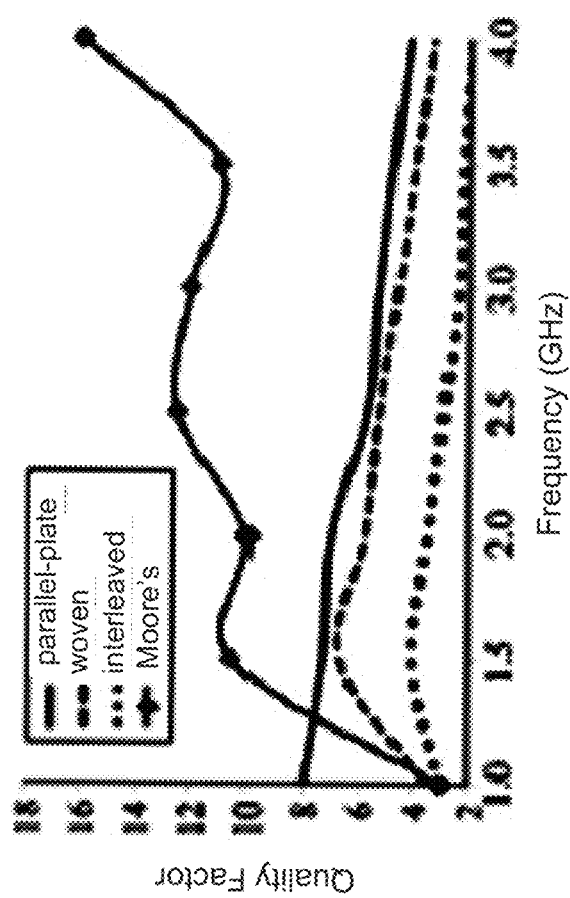
FIG. 7 is a diagram of a plot of quality factors against frequency for a single layer fixed fractal capacitor ("Moore's") versus parallel-plate (and woven & interleaved two layer fixed fractal capacitors) according to various embodiments of the present disclosure.

For comparison purposes, FIG. 7 displays a plot of quality factors against frequency for a single layer fixed fractal capacitor ("Moore's") versus parallel-plate (and woven & interleaved two layer fixed fractal capacitors). It is shown that the Q factor measurements are generally the highest for the single layer fixed fractal capacitor ("Moore's").

In the following, the benefits that are attained from using fractal capacitors in MEMS and the rationale behind choosing the Moore's Fractal are discussed. One observed benefit is effective area utilization. It is evident in FIG. 2, for example, how very little area is wasted in this geometry. The efficiency of area utilization here can be further confirmed by comparing it to the Koch Island geometry that has been previously used with conventional CMOS fractal capacitors. Most of the other fractal shapes also, will not enable similar effective area utilization including Snowflake, Sierpinski, or Menger Fractals for example.

Another advantage or benefit that the Moore's Geometry offers is symmetry, which enables connecting the terminals of the capacitors to the measurement pads efficiently with minimal wasted area as clearly illustrated in FIG. 2. Once again, the previously mentioned fractal geometries cannot readily provide this advantage.

Figure 8:
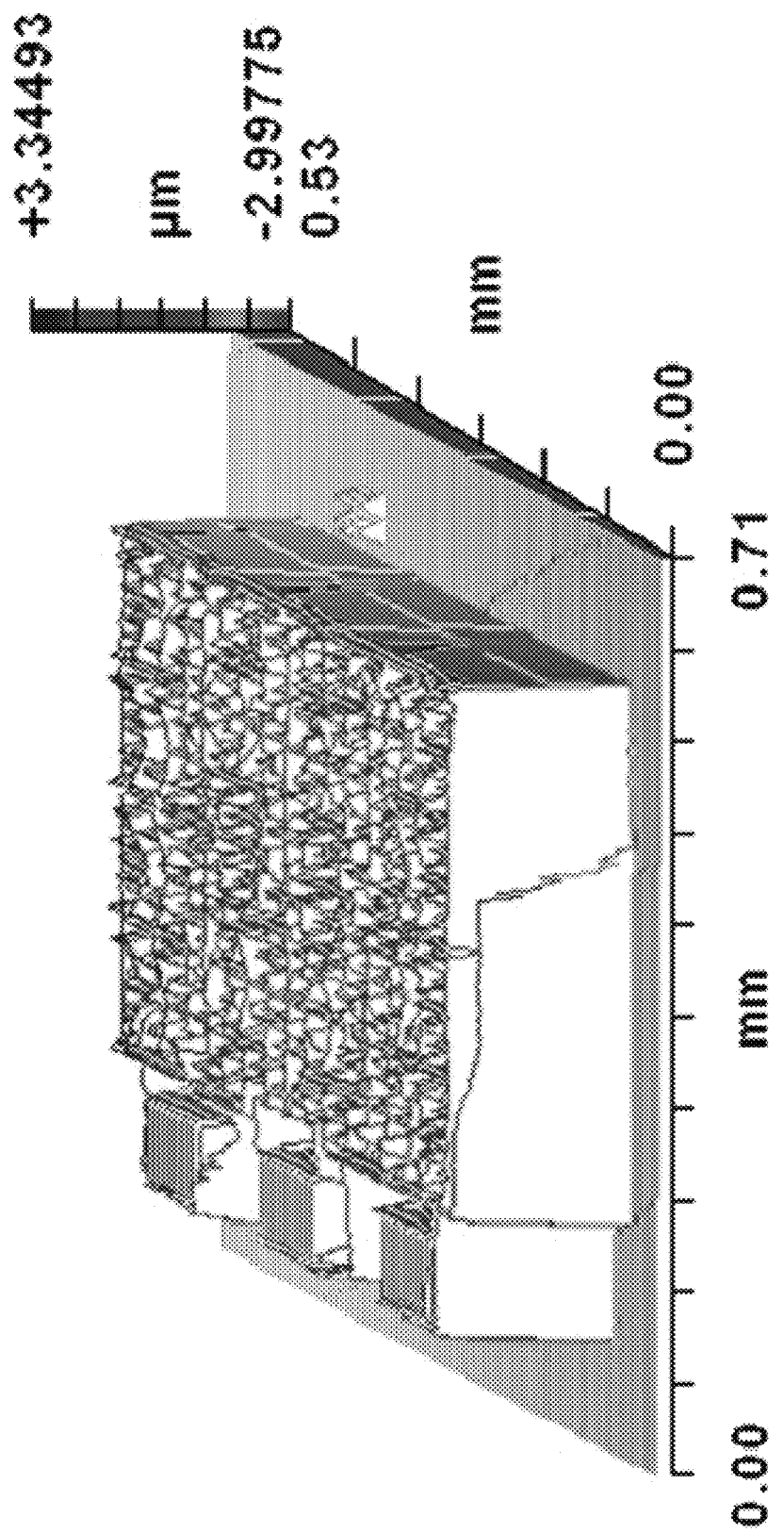
FIG. 8 is a diagram of an optical profiler image of a fixed fractal capacitor showing no warping being present according to various embodiments of the present disclosure.

A third benefit is suppression of residual stress. For example, PPCs in MEMS suffer from warping due to the residual stresses especially for large plates. In particular, in MEMS, when fabricating capacitors and typical parallel plates of capacitors (e.g., plates on bottom and plates on top), this fabrication process is happening at high temperatures. As the wafer cools down, the plates bend and suffer from warping. In contrast, when designing fractal capacitors, this issue is resolved or suppressed significantly. This is clearly seen in FIG. 2 where no light fringes (shadows) exist and is further confirmed by optical profiler images. For example, FIG. 8 shows an optical profiler image of a fractal capacitor of the present disclosure showing no warping being present.

Figure 9:
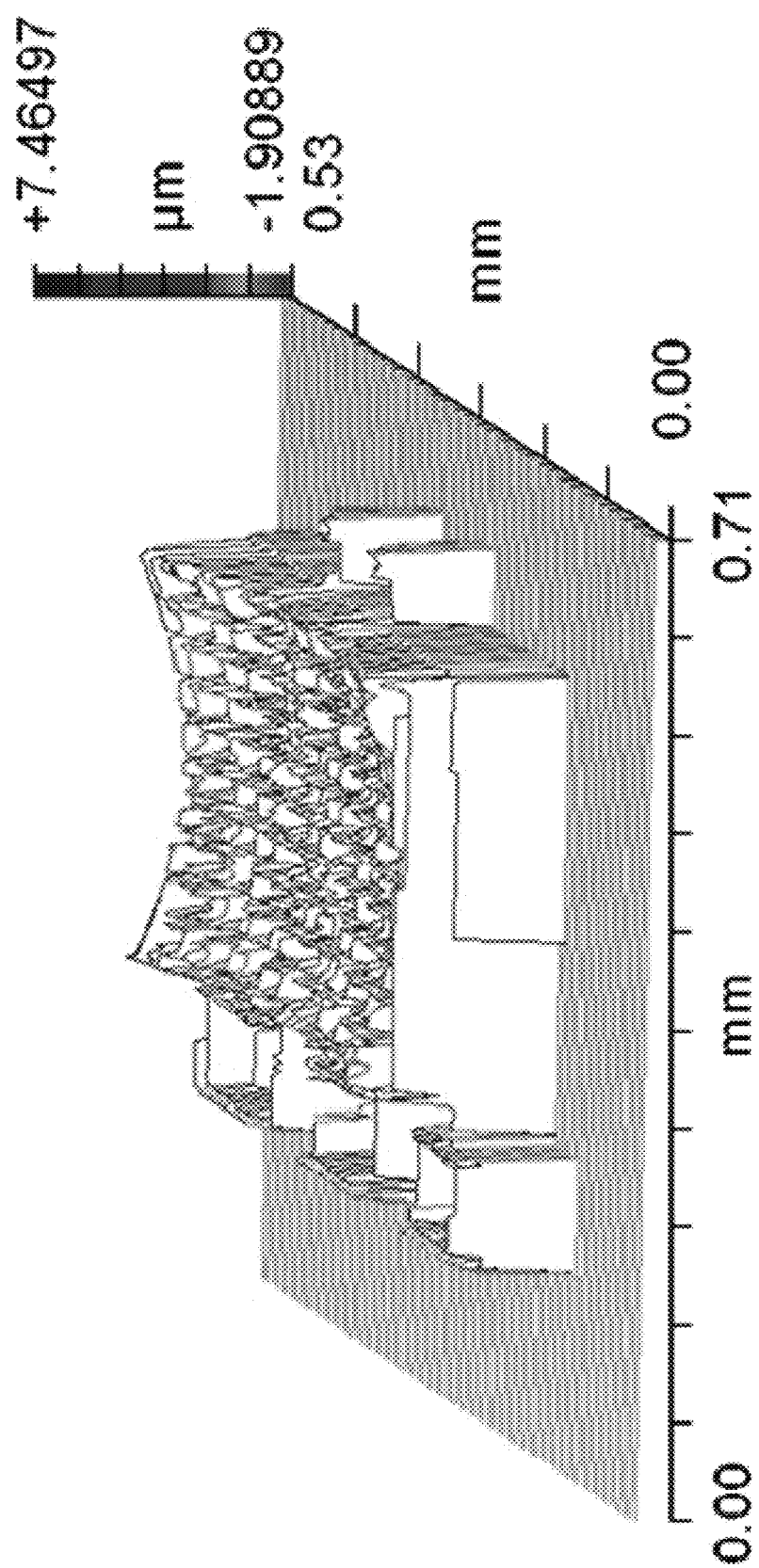
FIG. 9 is a diagram of an optical profiler image of a parallel plate capacitor showing warping being present as a point of comparison with embodiments of the present disclosure.

As a further example, as shown in FIG. 9, a PPC may be created on the same wafer with the same size and suffer a warping of 4.3 µm compared to 0.5 µm only in the fractal capacitors. Now, for CMOS fractal capacitors, this issue is not considered because the plates are laid on oxide and no etching takes place. Therefore, the issue of residual stress is inapplicable in CMOS.

An additional benefit is elimination of the need for etching holes. When fractals are used to create capacitors, the need for creating etch holes is eliminated (i.e. in higher order iterations as shown in FIG. 2). Since a separation between the terminals already exists, it serves the purpose of etching holes effectively and simultaneously shortens the etching time significantly. Optimizing the number, size, location, and perforation configuration of etching holes conventionally used in classical plates is not needed.

A further benefit is the ability to create capacitance within a single layer. This benefit is important for MEMS designers more than CMOS designers, because most CMOS processes possess many metal layers and the insulating oxide layer separating the metal layers is not etched away. MEMS processes, however, often have a single metal layer which is usually the top most layer above the other polysilicon layers. Therefore, from an RF point of view, polysilicon is lossy and will result in a degraded quality factor (Q). With fractal capacitors, the capacitor can be created in the single available metal layer for enhanced Q.

Reducing Parasitics (Enhancing Resonant Frequency and Q simultaneously) is another benefit. Because the metal layer is usually the top most layer (i.e. farthest from the substrate) and both the signal and ground terminals are on the same plane, the parasitic capacitance is reduced significantly in MEMS fractal capacitors. In turn, the self-resonant frequency (SRF) and Q increase. Note that this reduction in parasitics is attained without any fabrication intervention or post-processing whatsoever.

Table I summarizes the benefits mentioned above and compares them in light of the CMOS processes. The purpose of Table I is not to undermine CMOS fractal capacitors; rather, its purpose is to highlight the benefits that are readily available in the MEMS process if a fractal capacitor is used. An additional benefit listed is that the cost for MEMS fractal capacitors is generally less than CMOS fractal capacitors.

TABLE 1

| Criterion | MEMS Fractal Capacitors | CMOS Fractal Capacitors |
|---|---|---|
| Residual Stress | Warping suppressed | N/A |
| Need for Etching Holes | Eliminated (for higher order fractals) | N/A |
| Variation in fractal ratio | Can tailor process as desired (within usual fabrication limits) | Cannot - restricted to process |
| Removal of oxide (or not) | Possible; results in two distinct capacitance values | Not readily possible |
| Usually: a single metal layer is available | Solves the problem by creating the capacitor using this single layer | N/A - usually several available |
| Cost[1] | Usually cheaper than CMOS | Expensive |

[1]Cost is not restricted to fractals but is rather a general criterion.

It is noted that the benefits acquired by various embodiments are at the expense of a lower capacitance value compared to other capacitors, because a single layer is used only. In other embodiments, the fractal capacitors are created in two (or more) layers which resolve this problem (lower capacitance), as explained below.

The general idea of creating fractal capacitors in more than one layer to overcome the low capacitance problem is explained here by way of example for a fractal fixed capacitor in two layers. In one embodiment, a two-layer fractal fixed capacitor is comprised of a fractal shape and its complement on a top layer, and a fractal shape and its complement on a bottom layer. However, by taking a top view of the capacitor, one only sees the top fractal shape and its complement because the bottom fractal shape and its complement are hidden under the top layer. In this capacitor, a horizontal capacitance exists between the two terminals in the top layer, a horizontal capacitance exists between the two terminals in the bottom layer, and a vertical capacitance exists between the top and bottom layers. Extending this concept to a larger number of layers follows the same methodology.

In accordance with the present disclosure, a MEMS fractal capacitor utilizing the Moore's Geometry has been tested at frequencies as high as 20 GHz, which is the highest reported to date in PolyMUMPS. The high frequencies and high quality factors are possible because the capacitors are suspended 3.35 μm above the substrate, which reduces parasitics, in one embodiment. The aforementioned desirable characteristics are attained at the expense of a reduced capacitance value, in various embodiments.

As previously discussed, an important characteristic of the fixed fractal capacitors is that they decrease parasitic capacitances. For a typical parallel plate capacitor in CMOS, the area of the plate is large. For a fractal shape, the area is reduced. Therefore, there is less capacitance coupling with the substrate. When there is less capacitive coupling with the substrate, the parasitics are reduced. Because the parasitic capacitance is reduced, the resonant frequency of the capacitor is very high and the quality factor of the capacitor is high.

Embodiments of the present disclosure are representative of the first real fixed capacitor fabricated in the MEMS technology. Before now, a fixed MEMS capacitor with a fractal shape has not been published previously. Furthermore, no one has previously used the Moore's Fractal geometry in designing MEMS capacitors; and no one has previously reported resonant frequencies in excess of 20 GHz in PolyMUMPS. The RF MEMS industry will find this device useful, among others. For example, because the resonant frequency is very high, this device could be used for RF applications in wireless and satellite applications.

In an exemplary embodiment of a method in accordance with the present disclosure, a first plate is fabricated on a substrate such that it follows a specific fractal shape. At or about the same time, a second plate is fabricated on the substrate using a fractal shape that is complementary to the first one, wherein the first plate and the second plate are within the same plane and separated by a horizontal distance. A horizontal capacitance is then provided within the first plate and the second plate. In some embodiments, a vertical capacitance may be also introduced by adding a layer of plate(s) above the first and second plates. The added plates may also have fractal shapes, in some embodiments.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure.

It should be noted that ratios, percentages, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a percentage range of "about 0.1% to about 5%" should be interpreted to include not only the explicitly recited percentage of about 0.1% to about 5%, but also include individual percentages (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

The invention claimed is:

1. A fixed capacitor comprising:
    a capacitor body in a microelectromechanical system (MEMS) structure, the capacitor body comprising a first plate with an outer edge defining a fractal shape and a second plate with an outer edge defining a complementary fractal shape, where a lateral capacitance is provided by the first plate and the second plate, where the first plate and the second plate are within a single plane, where the first plate is horizontally separated from the second plate by at least a distance of separation thereby defining an air gap between the first plate and the second plate, where the first plate has a vertical thickness, and where a ratio of the vertical thickness to the distance of separation is greater than two; and
    a substrate above which the capacitor body is positioned.

2. The fixed capacitor of claim 1, wherein the fractal shape of the first plate and the complementary fractal shape of the second plate comprise a Moore's Fractal.

3. The fixed capacitor of claim 1, wherein the fixed capacitor has self resonant frequencies of at least 20 Gigahertz.

4. The fixed capacitor of claim 1, wherein the capacitor body is positioned 3.35 μm above the substrate.

5. The fixed capacitor of claim 1, wherein a single layer comprises the first plate, the second plate, a first terminal corresponding to the first plate, and a second terminal corresponding to the second plate.

6. A fixed capacitor comprising:
a top first plate in a top plane of a microelectromechanical system (MEMS) structure, where the top first plate has an outer edge defining a fractal shape;
a top second plate in the top plane, where the top second plate has an outer edge defining a complementary fractal shape complementary to the fractal shape of the top first plate, where the top second plate is horizontally separated from the top first plate by at least a distance of separation thereby defining an air gap between the top first plate and the top second plate, where a top lateral capacitance is provided by the top first plate and the top second plate, where the top second plate has a vertical thickness, and where a ratio of the vertical thickness to the distance of separation is greater than two;
a bottom first plate in a bottom plane of the MEMS structure, where the bottom first plate has another fractal shape; and
a bottom second plate in the bottom plane, where the bottom second plate is horizontally separated from the bottom first plate, where the bottom second plate has another complementary fractal shape complementary to the other fractal shape of the bottom first plate, and where a bottom lateral capacitance is provided by the bottom first plate and the bottom second plate.

7. The fixed capacitor of claim 6, wherein a vertical capacitance is provided between the top first plate and the bottom first plate and between the top second plate and the bottom second plate.

8. The fixed capacitor of claim 6, further comprising a first terminal created from a first metal layer comprising the top first plate and the top second plate, and a second terminal created from a second metal layer comprising the bottom first plate and the bottom second plate.

9. The fixed capacitor of claim 6, wherein a first layer comprises the top first plate and the top second plate, a second layer comprises the bottom first plate and the bottom second plate, and a total amount of layers in the MEMS structure includes the first layer, the second layer, and at least one additional layer that provides additional capacitance.

10. The fixed capacitor of claim 9, wherein the total amount of layers exceeds three.

11. The fixed capacitor of claim 6, further comprising an additional layer of plates positioned above the top first plate and the top second plate.

12. The fixed capacitor of claim 6, wherein the bottom second plate is horizontally separated from the bottom first plate by a solid dielectric.

13. The fixed capacitor of claim 1, wherein the ratio is customizable.

14. The fixed capacitor of claim 1, wherein a first layer comprises the first plate and the second plate, and a total amount of layers in the MEMS structure includes the first layer and at least one additional layer that provides additional capacitance.

15. The fixed capacitor of claim 1, wherein the second plate has a same vertical thickness as the vertical thickness of the first plate.

16. The fixed capacitor of claim 6, wherein the top first plate has a same vertical thickness as the vertical thickness of the top second plate.

* * * * *